United States Patent [19]

Merli et al.

[11] Patent Number: 4,698,597
[45] Date of Patent: Oct. 6, 1987

[54] SUPPRESSED-FUNDAMENTAL FREQUENCY THREE-WAY PREDISTORTER

[75] Inventors: Gabriele Merli; Termano Testi, both of Milan, Italy

[73] Assignee: GTE Telecommunicazioni S.p.A., Milan, Italy

[21] Appl. No.: 773,689

[22] Filed: Sep. 5, 1985

[30] Foreign Application Priority Data

Oct. 31, 1984 [IT] Italy ................................ 23409 A/84

[51] Int. Cl.⁴ .......................... H04B 1/00; H03B 1/00
[52] U.S. Cl. ..................................... 328/163; 328/165; 455/43
[58] Field of Search ............... 328/162, 163, 165, 149; 307/520, 521; 455/43, 50, 42, 63

[56] References Cited

U.S. PATENT DOCUMENTS

| | | | |
|---|---|---|---|
| 3,374,435 | 3/1968 | Engel | 328/162 |
| 3,889,199 | 6/1975 | Gutleber | 328/163 |
| 4,311,963 | 1/1982 | Watanabe et al. | 328/163 |
| 4,329,655 | 5/1982 | Nojima et al. | 328/163 |

Primary Examiner—Stanley D. Miller
Assistant Examiner—Timothy P. Callahan
Attorney, Agent, or Firm—Jeffrey P. Morris

[57] ABSTRACT

A predistorter for use in transmission systems which employ power amplifiers, employing traveling wave tubes or field effect transistors. Since these active components present a nonlinear characteristic, which introduce amplitude and phase distortion in the amplified signal, the distorter circuit operates to subtract the distortion products from the output signal. In the present arrangement, the subtraction takes place before amplifying the signal by means of generation of distortion products which will present the same amplitude and opposite phase of those that will be generated by the power amplifier in order to obtain an undistorted and amplified signal.

6 Claims, 5 Drawing Figures

SUPPRESSED-FUNDAMENTAL FREQUENCY THREE-WAY PREDISTORTER

The present invention relates to transmission systems where an amplitude modulation is present or, anyway, where said modulation is associated to other types of modulation and relates particularly to a predistorter circuit capable of linearizing the response of a following distorting device and therefore balancing the distortions which in various cases are not tolerated.

It is well known that in power amplifiers there are generated distortions which are balanced by means of predistorting devices.

In radio link transmitters, power amplifiers are included. The principal component of such amplifiers are usually traveling wave tubes or field effect transistors. These active components present a nonlinear characteristic, which introduce amplitude and phase distortion in the amplified signal.

It is very well known to those skilled in the art that a distorted signal can be represented with a Taylor series where y is equal to $A1f + A3f^3 + A5f^5 + \ldots$ and that the "$A1f$" signal is considered the so-called "fundamental" signal, while the $A3f^3$, $A5f^5$, etc. signals are referred to as "distortion products".

To obtain an "undistorted" amplified signal, it is necessary to subtract the "distortion products" from the output signal. It is also well known that it is more desirable to effect such subtraction before amplifying the signal by means of "predistorting devices", which generate exactly the $A3f^3 + A5f^3 + \ldots$ components.

Said prior art solutions have the following disadvantages. The one-way predistorter is very critical because of the interdependence between the level of the fundamental and the level of the distortion products. The two-way predistorter effects a critical suppression of the fundamental because it does not provide for the regulation of the fundamental and therefore does not permit the isolation of the distortion products. The linearization of the following distorting device, therefore, cannot be easily made optimal.

It is the object of the present invention to obviate these and other disadvantages of the prior art predistorters by means of a suppressed-fundamental frequency predistorter.

More particularly the suppressed fundamental frequency predistorter according to the invention is characterized in that it is provided with means adapted to fully isolate the distortion products and means adapted to regulate the distortion products alone and comprises a three-way distributor circuit which distributes the input signal on three outputs, a distortion and fundamental suppression unit connected to two outputs of the distributor circuit and comprising a distorter circuit which generates distortion products, in addition to the fundamental coming from an output of the distributor, an amplitude regulator, a phase regulator and an adder circuit for adding signals with opposite phases, the distortion and fundamental suppression unit being adapted to isolate at its output the distortion products alone, an amplitude regulator and a phase regulator, adapted to regulate amplitude and phase of the already isolated distortion products alone, a delay line acting as a time equalizer of the fundamental coming from a third output of the distributor, and an adder circuit adapted to add the distortion products alone regulated by the amplitude regulator and phase regulator, to the fundamental coming from the delay line to provide the desired linearizing signal.

The predistorter according to the invention makes it possible to isolate the distortion products by perfectly suppressing the fundamental by means of a phase and amplitude regulation, thereafter to phase and amplitude regulate the distortion products alone and finally to combine them with the undistorted signal. The resultant signal is the desired linearizing signal.

These and other features of the invention will become more apparent from the following description of some embodiments thereof, given by way of example and in no limiting sense, referring to the accompanying drawings in which.

Figure 1:
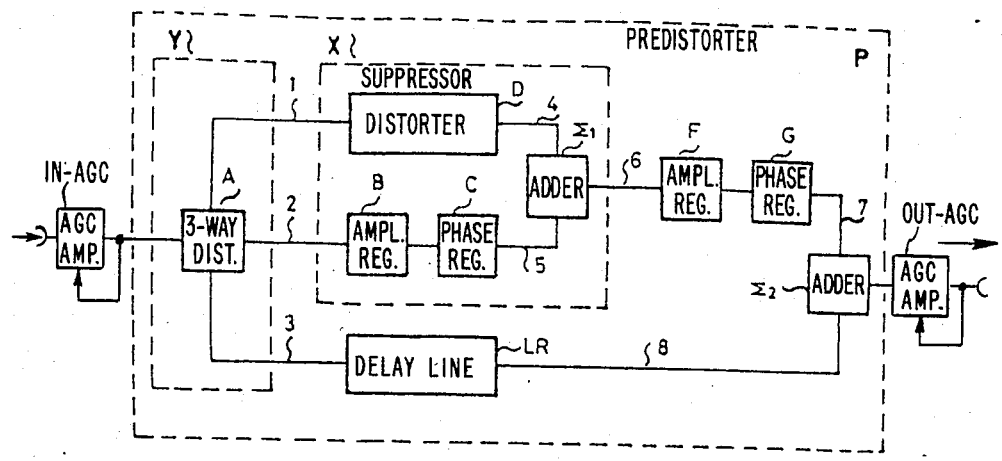
FIG. 1 is a block diagram of a first embodiment of the predistorter block.

Referring to FIG. 1, IN-AGC indicates an input circuit which assures a constant operation point to the predistorter. IN-AGC is substantially a conventional amplifier with automatic gain control.

In the following description, the term "following distortion device" stands for a power amplifier which contains either a traveling wave tube or field effect transistor or similar components with the aim of the predistorter being to generate distortion products which present the same amplitude in opposite phase of those that are generated by the power amplifier in order to obtain an undistorted amplified signal.

In the present invention, the input signal is the modulated signal that must be amplified and in absence of the predistorter, it would be the input signal of the power amplifier.

The output signal is that which is still to be amplified, but a signal with the same amplitude and opposite phase of the distortion products that the power amplifier will generate.

Figure 2:
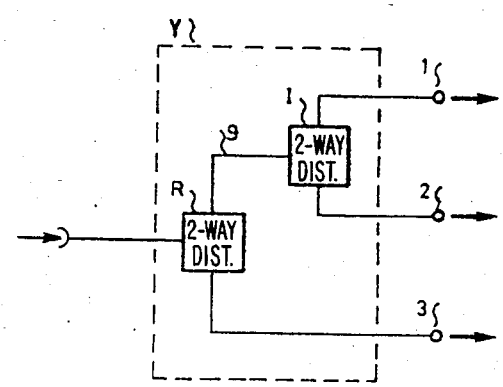
FIG. 2 is a block diagram of a second embodiment of the three-way distributor block of the predistorter of FIG. 1.

As noted, the object of the present invention is to generate "improved" distortion products in which the presence of the fundamental signal is strongly reduced. This aim is obtained using a three-way splitter. Referring to FIG. 2, it can be seen that by means of the two-way distributor, the input signal is divided in two parts, one of which, by means of a second two-way distributor I, is further divided into two other signals numbered 1 and 2. Referring now back to FIG. 1, the fundamental signal 1 goes to the distorter circuit D, so that at the output of the distorter circuit D there is present a signal 4 formed by the fundamental signal and by the distortion products. Again, as may be seen by referring to FIG. 1, amplifier regulator B and phase regulator C with their variable components have the aim of adjusting the amplitude and phase of the fundamental signal 2 so that at their output, the signal 5 has exactly the same amplitude and opposite phase of the fundamental signal contained in signal 4. This is one of the most important features of the present circuitry because in such a way at the output signal 6, the fundamental signal has been attenuated more than 50 dB. Besides, with said regulation, it is possible to recover the component tolerances in order to obtain a good compensation for the devices produced. Another important feature of the present invention is represented by regulating amplifier F and phase regulator G. As noted previously, the signal 6 contains the distortion products generated by distorter D. These distortion products should have the same amplitude and opposite phase of the ones that will be generated by the power amplifier. Commercial production of traveling wave tube or field effect transistor components present a certain amount of tolerances. Thus, they can be expected to generate different distortion. By means of the variable components contained in the regulating amplifier F and the phase regulator G, it is possible to adjust the amplitude and phase of the distortion products in such a way that the distortion products 7 present exactly the same amplitude in opposite phase of the ones to be generated by the power amplifier. Referring again to FIG. 1, the IN-AGC amplifier and the OUT-AGC amplifier circuits "force" the device to always operate in the same condition, compensating for variations of the various components with temperature and age.

P indicates the predistorter block according to the invention comprising the following blocks: Y indicates the three-way distributor block consisting in FIG. 1 of a single three-way distributor circuit (A) which distributes the input signal at the predistorter P on the leads 1, 2, 3; X indicates the distortion and fundamental suppression unit consisting of a first way connected to the input 1 comprising a distorter circuit (D), a second way connected to the input 2 comprising an amplitude regulator (B) and a phase regulator (C), and an adder of signals with opposite phases ($\epsilon 1$) adapted to substract from the distorted signal coming on a lead 4, the fundamental coming from a lead 5 so that a signal consisting of the distortion products alone comes to the output 6 of the block X; F indicates an amplitude regulator and G indicates a phase regulator, both adapted to regulate the distortion products which are present at the output 6 of the block X; LR indicates a delay line acting as a time equalizer of the signal coming on the lead 3; $\epsilon 2$ indicates a signal adder adapted to add the distortion products alone coming on a lead 7 to the signal coming on a lead 8.

Referring to FIG. 2, Y indicates a second embodiment of the three-way distributor block of FIG. 1; R indicates a resistive two-way distributor which distributes the signal at the input of the predistorter P on the leads 3 and 9; I indicates an inductive two-way distributor which distributes the signal coming from the conductor 9 on the leads 1 and 2 and causes a suitable phase shift between the two output signals.

Figure 3:
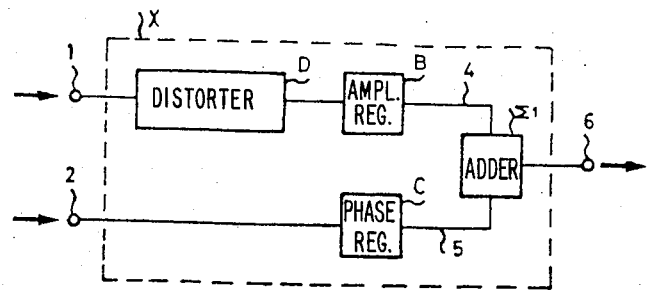
FIG. 3 is a block diagram of a second embodiment of the distortion and fundamental suppression unit of the predistorter of FIG. 1.

Referring to FIG. 3, X indicates a second embodiment of the distortion and fundamental suppression unit of FIG. 1. The first way connected to the input 1 comprises a distorter circuit D and the amplitude regulator B. The second way connected to the input 2 comprises the phase regulator C; $\epsilon 1$ indicates the adder of signals with opposite phase as in FIG. 1.

Figure 4:
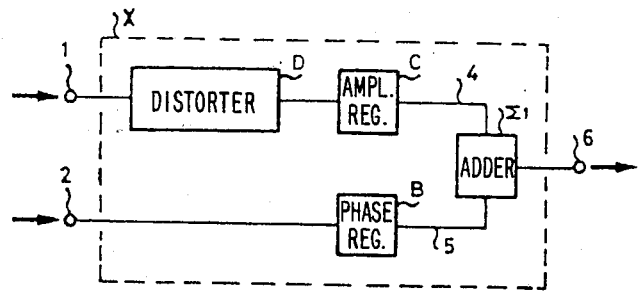
FIG. 4 is a block diagram of a third embodiment of the distortion and fundamental suppression unit of the predistorter of FIG. 1.

Referring to FIG. 4, X indicates a third embodiment of the distortion and fundamental suppression unit of FIG. 1. The first way connected to the input 1 comprises the distorter circuit D and the phase regulator C; the second way connected to the input 2 comprises the amplitude regulator B; $\epsilon 1$ indicates the adder of signals with opposite phase as in FIG. 1.

Figure 5:
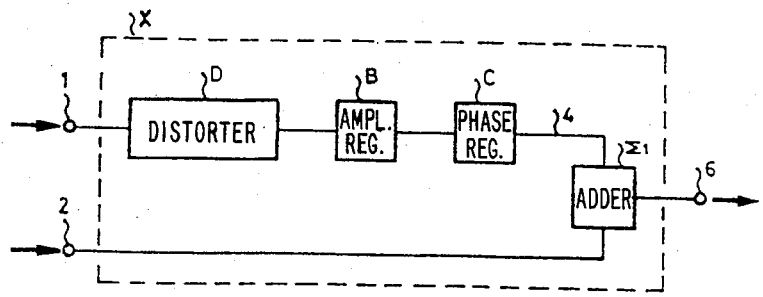
FIG. 5 is a block diagram of a fourth embodiment of the distortion and fundamental suppression unit of the predistorter of FIG. 1.

Referring to FIG. 5, X indicates a fourth embodiment of the distortion and fundamental suppression unit of FIG. 1. The first way connected to the input 1 comprises the distorter circuit D, the amplitude regulator B and the phase regulator C. The second way connected to the input 2 does not comprise any regulation circuit. $\epsilon 1$ indicates the adder of signals with opposite phase adapted to substract from the distorted signals coming on the lead 4 the fundamental coming on the lead 2.

The operation principle of the predistorter block will be described with reference in particular to FIG. 1.

The input signal to the three-way distributor A is distributed on the three ways represented by the leads 1, 2, 3.

The fundamental at the output from A on the lead 1 is fed to the distorter circuit D which generates the distortion products. The output signal from D on the lead 4 consists, therefore, of the fundamental and the distortion products.

The fundamental at the output from A on the lead 2 is suitably amplitude regulated by means of the regulator B and phase regulated by means of the regulator C. The fundamental downstream of the regulator B and C on the lead 5 has the same amplitude and opposite phase with respect to the fundamental frequency of the signal on the lead 4.

The adder circuit of signals having opposite phase $\epsilon 1$ is adapted to substract from the distorted signal coming on the lead 4 the fundamental coming on the lead 5.

The output signal from $\epsilon 1$ on the lead 6, consisting of the distortion products alone is suitably amplitude regulated by means of the regulator F and phase regulated by means of the regulator G. The distortion products downstream of the regulators F and G on the lead 7 have thus the same amplitude and opposite phase with respect to the distortion products generated by the following distorting device.

The fundamental at the output from A on the lead 3 reaches the delay line LR which is suitably dimensioned for the time equalization of the signal. The fundamental at the output from LR on the lead 8 is time equalized with respect to the signal consisting of the distorion products alone on the lead 7.

The signal adder circuit 2 is adapted to add to the fundamental coming on the lead 8 the distortion products alone coming on the lead 7. The output signal from 2 is the signal consisting of the fundamental and the distortion products alone which linearize the following distorting device.

The operation principle of the three-way distributor block Y of FIG. 2 is the following:

The input signal to the two-way resistive distributor R is distributed on the lead 3, connected to the delay line LR of FIG. 1 and on the lead 9, connected to the two-way inductive distributor I. This causes a fixed phase shift between the output signals on the leads 1 and 2. The phase shift between the input signals on the leads 1 and 2 to the distortion and fundamental suppression unit (designated X in FIGS. 1, 3, 4 and 5) simplifies the regulation operation of the phase shift between said signals necessary for obtaining the suppression of the fundamental.

The operation principle of the distortion and fundamental suppression unit X of FIG. 3 is the following:

To the fundamental coming on the lead 1 the distortion products generated by the distorter circuit D are added. The resultant composite signal is suitably amplitude regulated by means of the regulator B. The fundamental downstream of the regulator B on the lead 4 has an amplitude equal to that of the fundamental coming on the lead 2. This fundamental is in turn phase regulated by means of the regulator C. The fundamental downstream of the regulator C on the lead 5 has a phase opposite to that of the fundamental on the lead 4. The operation of the adder of signals having opposite phase ε1 is the same as that described for the predistorter block of FIG. 1.

The operation principle of the block X of FIG. 4 is the following.

To the fundamental coming on the lead 1 the distortion products generated by the distorter circuit D are added. The resultant composite signal is suitably phase regulated by means of the regulator C. The fundamental downstream of the regulator C on the lead 4 has a phase opposite to that of the fundamental coming on the lead 2. This fundamental is in turn amplitude regulated by means of the regulator B. The fundamental downstream of the regulator B on the lead 5 has an amplitude equal to that of the fundamental coming on the lead 4. The operation of the adder circuit of signals with opposite phase ε1 is the same as that described for the predistorter block of FIG. 1.

The operation principle of the block X of FIG. 5 is the following.

To the fundamental coming on the lead 1 the distortion products generated by the distorter circuit D are added. The resultant composite signal is suitably amplitude regulated by means of the regulator B and phase regulated by means of the regulator C. The fundamental downstream of the regulators B and C has the same amplitude and opposite phase with respect to the fundamental coming on the lead 2. The adder circuit of signals with opposite phase ε1 is adapted to substract from the distorted signal coming on the lead 4 the fundamental coming on the lead 2. The output signal from ε1 on the lead 6 consists of the distortion products alone.

While but some embodiments of the invention have been described and illustrated, it is obvious that a number of changes and modifications can be made without departing from the scope of the invention.

We claim:

1. A suppressed-fundamental frequency predistorter, characterized in that it is provided with means adapted to fully isolate any distortion products included in an in-coming signal connected to said predistorter and means adapted to regulate the distortion products comprising:

a three-way distributor circuit which distributes the input signal on first, second and third outputs, a distortion and fundamental suppression unit connected to said first and second outputs of the distributor circuit and comprising a distorter circuit connected to said first output, which generates distortion products, in addition to the fundamental coming from said first output of the distributor, a first amplitude regulator, and a first phase regulator connected to said second output and a first adder circuit connected to said distorter circuit and to said first phase regulator for adding signals from said distorter and said first phase regulator, with opposite phases, the distortion and fundamental suppression unit including an output and operated to isolate at said output the distortion products alone, a second amplitude regulator and a second phase regulator connected to said first adder circuit, operated to regulate the amplitude and phase of the isolated distortion products alone, a delay line connected to said distributor circuit third output acting to delay the fundamental coming from said third output of the distributor, and a second adder circuit connected to said second phase regulator and to said delay line operated to add the distortion products alone regulated by said second amplitude regulator and said second phase regulator, to the fundamental coming from the delay line, whereby the desired linearizing signal is generated.

2. A predistorter as claimed in claim 1, characterized in that the first amplitude regulator and the first phase regulator of the distortion and fundamental suppression unit are series connected between said second output of the distributor circuit and a first input of the first adder circuit of the distortion and fundamental suppression unit, said first adder circuit having a second input connected to an output of the distorter circuit.

3. A predistorter as claimed in claim 1, characterized in that the first amplitude regulator of the distortion and fundamental suppression unit has an input connected to an output of the distorter circuit, the first phase regulator of the distortion and fundamental suppression unit has an input connected to said second output of the distributor circuit and the first signal adder circuit of the distortion and fundamental suppression unit has a first input connected to an output of the first amplitude regulator and a second input connected to an output of the first phase regulator.

4. A predistorter as claimed in claim 1, characterized in that the first phase regulator of the distortion and fundamental suppression unit has an input connected to an output of the distorter circuit, the first amplitude regulator of the distortion and fundamental suppression unit has an input connected to said second output of the distributor circuit and the first signal adder circuit of the distortion and fundamental suppression unit has a first input connected to an output of the first phase regulator and a second input connected to an output of the first amplitude regulator.

5. A predistorter as claimed in claim 1, characterized in that the first amplitude regulator and the first phase regulator of the distortion and fundamental suppression unit are series connected between an output of the distorter circuit and an input of the first adder circuit of the distortion and fundamental suppression unit, said first adder circuit having a second input connected to said second output of the distributor circuit.

6. A predistorter as claimed in claim 1, characterized in that the distributor circuit consists of a two-way resistive distributor followed on one way by a two-way inductive distributor acting as a phase shifter between the two signals at its outputs.

* * * * *